United States Patent [19]

Takiar et al.

[11] Patent Number: 5,629,563
[45] Date of Patent: May 13, 1997

[54] COMPONENT STACKING IN MULTI-CHIP SEMICONDUCTOR PACKAGES

[75] Inventors: Hem P. Takiar, Fremont; Uli H. Hegel, Novato; Peter H. Spalding, Cupertino; James L. Crozier, San Jose; Michelle M. Hou-Chang; Martin A. Delateur, both of Sunnyvale, all of Calif.

[73] Assignee: National Semiconductor Corporation, Santa Clara, Calif.

[21] Appl. No.: 554,797

[22] Filed: Nov. 7, 1995

Related U.S. Application Data

[63] Continuation of Ser. No. 295,982, Aug. 25, 1994, abandoned.

[51] Int. Cl.[6] .................................................. H07L 49/02
[52] U.S. Cl. ........................ 257/723; 257/724; 257/725; 257/528; 257/531; 257/532; 257/536
[58] Field of Search ........................................ 257/723, 724, 257/725, 531, 532, 533, 536, 277, 278, 528

[56] References Cited

U.S. PATENT DOCUMENTS

| | | | |
|---|---|---|---|
| 3,714,709 | 2/1973 | Liederbach | 257/532 |
| 3,748,548 | 7/1973 | Haisty et al. | 257/878 |
| 3,958,075 | 5/1976 | Kaufman | 174/16.3 |
| 4,754,316 | 6/1988 | Reid | 257/686 |
| 4,766,412 | 8/1988 | Takakura et al. | 338/334 |
| 4,853,759 | 8/1989 | Haque | 257/533 |
| 5,157,582 | 10/1992 | Sugita et al. | 361/321 |
| 5,196,915 | 3/1993 | Ito et al. | 257/536 |
| 5,298,787 | 3/1994 | Bozler et al. | 257/523 |
| 5,312,765 | 5/1994 | Kanber | 257/169 |
| 5,382,827 | 1/1995 | Wang et al. | 257/691 |
| 5,541,442 | 7/1996 | Keil et al. | 257/531 |

FOREIGN PATENT DOCUMENTS

| | | |
|---|---|---|
| 0469491 | 7/1992 | European Pat. Off. . |
| 57-130453 | 8/1982 | Japan . |
| 62-101064 | 5/1987 | Japan . |
| 2133933 | 8/1984 | United Kingdom . |

OTHER PUBLICATIONS

IBM Technical Disclosure Bulletin, "Internal Components on Printed Circuit Boards by Hybrid Circuit Technique", vol. 37, No. 02B Feb. 1994, pp. 359–360.

*Primary Examiner*—Sara W. Crane
*Assistant Examiner*—David B. Hardy
*Attorney, Agent, or Firm*—Hickman Beyer & Weaver

[57] ABSTRACT

A multi-chip packaging arrangement that contemplates stacking discrete components over film based components is disclosed. The multi-chip package includes a substrate having one or more film based components formed thereon. A discrete component is mounted on the substrate over the film based component such that it is electrically isolated from the film based component. One or more die components are also mounted on the substrate and a plurality of leads are provided for electrically connecting the multi-chip package to external circuitry. Wiring traces formed on the substrate are provided to electrically connect various ones of the components and the leads. A packaging material is provided to encapsulate the components and the wiring traces and leaves a portion of the leads exposed to facilitate electrically connecting the multi-chip package to external circuitry. Methods of making such multi-chip packages are also disclosed.

20 Claims, 6 Drawing Sheets

COMPONENT STACKING IN MULTI-CHIP SEMICONDUCTOR PACKAGES

This is a continuation of application Ser. No. 08/295,982 filed Aug. 25, 1994, now abandoned.

FIELD OF THE INVENTION

The present invention relates generally to the packaging of multi-chip semiconductor devices. More particularly, an arrangement and method for stacking discrete components over film based component is described.

BACKGROUND OF THE INVENTION

In the semiconductor industry, there are continuing efforts to increase the functionality of various products while reducing costs and (when appropriate) reducing the size of the packaged products. These efforts have lead to the increased usage of multi-chip packages (MCPs) which include a plurality of integrated circuits in a single package, multi-chip modules (MCMs) which include a plurality of integrated circuits in a single module, hybrid packages which incorporate other components such as resistors, capacitors, inductors and crystals into a package together with one or more integrated circuits, and multi-component packages which include a plurality of components in a single package. Although there is no consistent terminology in the art, the term "multi-chip package" appears to be the most accepted and will be used herein to refer to each of these types of packages, regardless of the number of chips that the package actually houses.

A representative multi-chip package is diagrammatically illustrated in FIG. 1. As seen therein, the multi-chip package 110 includes a substrate 112 that supports a plurality of dies 114, a plurality of film based components 116 (which in the embodiment shown are printed resistors), and a plurality of discrete components 118 (which in the embodiment shown are capacitors). A lead frame 120 with leads 121 is provided to electrically couple the devices to external circuitry and wiring traces 123 are arranged to electrically couple the various associated components together and to associated lead frame leads. Further landing 125 may be provided to support the discrete components and electrically connect the discrete components. The dies may be connected to their associated traces or leads by wire bonding. When connecting bonding wires to traces, the traces are often gold plated to facilitate better bonding. Although this type of packaging has worked well to date, there are continuing efforts to increase the density of components on a designated amount of package substrate "real estate" in a cost effective manner.

SUMMARY OF THE INVENTION

Accordingly, in order to further facilitate the space efficient packaging of various components in a multi-chip package and in accordance with the purpose of the present invention, a multi-chip packaging arrangement that contemplates stacking discrete components over film based components is disclosed. The multi-chip package includes a substrate having one or more film based components formed thereon. A discrete component is mounted on the substrate over the film based component such that the discrete element is electrically isolated from the film based component from the discrete component. One or more die components are also mounted on the substrate and a plurality of leads are provided for electrically connecting the multi-chip package to external circuitry. Wiring traces formed on the substrate are provided to electrically connect various ones of the components and the leads. A packaging material is provided to encapsulate the components and the wiring traces and leaves a portion of the leads exposed to facilitate electrically connecting the multi-chip package to external circuitry.

In one embodiment, the electrical isolation may be accomplished by leaving a gap between the discrete component and the film based component during assembly. When plastic molding encapsulation is used, the plastic material may fill the gap during the encapsulation process. When other packages are used, the gap may remain an air gap. In another embodiment, a passivazation layer is formed over at least the film based component(s) that is subjected to stacking to electrically isolate the film based component from the discrete component.

In one embodiment, the film based component(s) are selected from a group consisting of a capacitor, a resistor, and an inductor. The film based component(s) may be thick film components formed by printing or thin film components formed by deposition. In another embodiment, the discrete component(s) are selected from a group consisting of a capacitor, a resistor, an inductor and a crystal.

In a method aspect of the invention, wiring traces and the film based component(s) are formed on the substrate. A passivazation layer is then formed over at least the film based component(s) that are intended for stacking. The die component(s) and the discrete component(s) are then mounted on the substrate. The discrete component(s) intended for stacking are stacked over the film based component after application of the passivazation layer such that the passivazation layer electrically insulates the film based component from the discrete component. The various components and wiring traces are then encapsulated together with a portion of any lead frame to form a multi-chip semiconductor package.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 2:
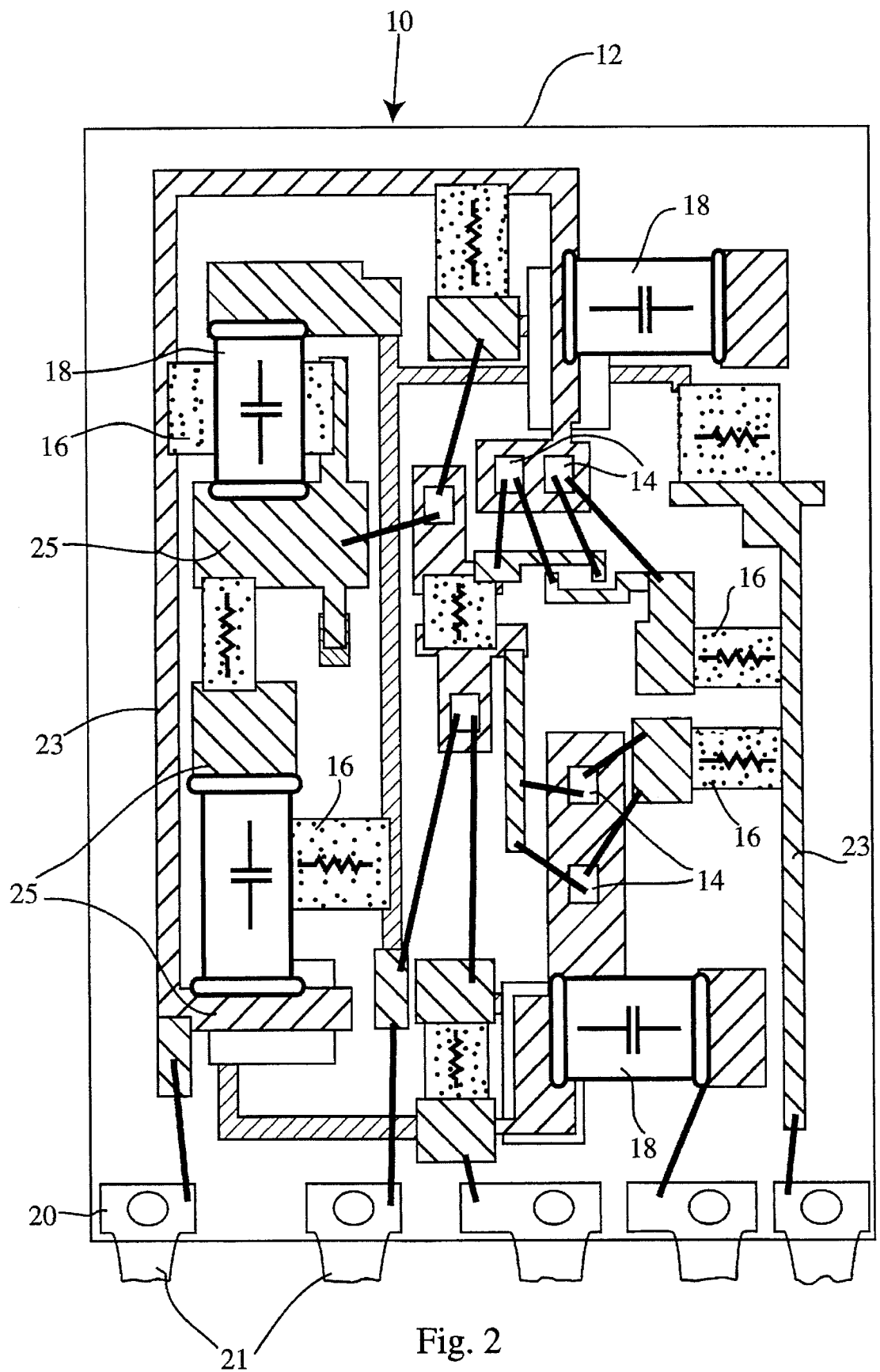
FIG. 2 is a diagrammatic top plan view of a multi-chip package layout that stacks components in accordance with one embodiment of the present invention that is created using the steps illustrated in FIGS. 3–6.

Referring initially to FIG. 2, a multi-chip package having stacked components in accordance with one embodiment of the present invention will be described. As seen therein, a multi-chip package 10 includes a substrate 12 that supports a plurality of dies 14, a plurality of film based components 16, a plurality of discrete components 18, a lead frame 20 having leads 21, wiring traces 23 and landing 25. The multi-chip package is arranged such that at least some of the discrete components 18 are "stacked" over associated film based components. A gap or a passivazation layer (not shown) is provided between the stacked components in order to electrically isolate the stacked components from one another. In the embodiment shown, each of the discrete components is stacked, although this is not a requirement. It should be appreciated that the terms multi-chip packages, multi-chip modules and multi-chip packages are often used interchangeably in the trade, although they are not always intended to be interchangeable. For the purposes of this description, a "multi-chip" package will be considered any package which includes both a die and a plurality of discrete (non-die) electrical components such as resistors, capacitors, inductors and crystals. In the embodiment shown, the multi-chip package is also a multi-chip package since it has more than one die, although this is not a requirement.

The substrate 12 may be formed from any suitable substrate material including ceramic materials such as aluminum oxide and aluminum nitride or non-ceramic materials such as silicon. The dies 14 are electrically coupled to associated traces 23 or leads 21 by any suitable method. In the embodiment shown, the connections are made using bonding wires 33, although other conventional connection techniques such a TAB (tape automated bonding) and others could be used as well. The bonding wires 33 may also be used to electrically connect various traces to their corresponding leads. The bonding wires may be made from any suitable material such as gold or aluminum. When gold is used, it may be desirable to coat the associated traces 23 with a gold film to facilitate better bonding. When other bonding wires are used, other platings may be suitable.

The film based components 16 may be formed using any conventional technique such as by printing or deposition. Films that are applied using printing techniques are typically referred to as "thick" films whereas films that are applied using deposition techniques are typically referred to as "thin" films. By way of example, when screen printing is used as the film forming technique to form a resistor, a resistive glass paste may be screened into place directly on the substrate. When thin film techniques are used, the film products are typically built into the substrate. A variety of film based components may be formed using conventional printing and deposition techniques. By way of example, the most common are resistors, inductors and capacitors. In the embodiment shown, the film based components 16 shown are printed resistors. The discrete components 18 may take the form of any suitable discrete component that is used in a multi-chip circuit package. The most common discrete components are capacitors, inductors, resistors and crystals. In the embodiment shown, the discrete components are capacitors. Although the embodiment shown includes a plurality of dies, a plurality of film based components and a plurality of stacked discrete components, the invention is equally applicable to embodiments where there is just one of any of these categories of components.

The electrical isolation of the film based component and the discrete component may be accomplished in a variety of manners. One simple approach is to apply a passivazation layer therebetween. Another approach would be to leave an air gap there between during mounting. When glob topping or plastic encapsulation is used to protect the assembly, the glob topping material or plastic may enter the air gap and provide the necessary electrical isolation. Otherwise, the air gap can remain and provide good electrical isolation.

The lead frame 20 has a plurality of isolated leads 21 that are provided to electrically couple the devices in the multi-chip circuit to external circuitry. The wiring traces 23 are arranged to electrically couple various associated components together and to electrically couple various components to associated lead frame leads. The lead traces may be formed in any conventional manner, as for example by deposition of a conducting material on the surface of the substrate 12. Suitable conducting materials include palladium silver, platinum silver, gold and the like. The landing 25 are provided to support the discrete components and electrically connect the discrete components to associated traces and/or other components. Any suitable solder or conductive epoxy may be used to secure the components to their associated traces or substrate material.

Figure 1:
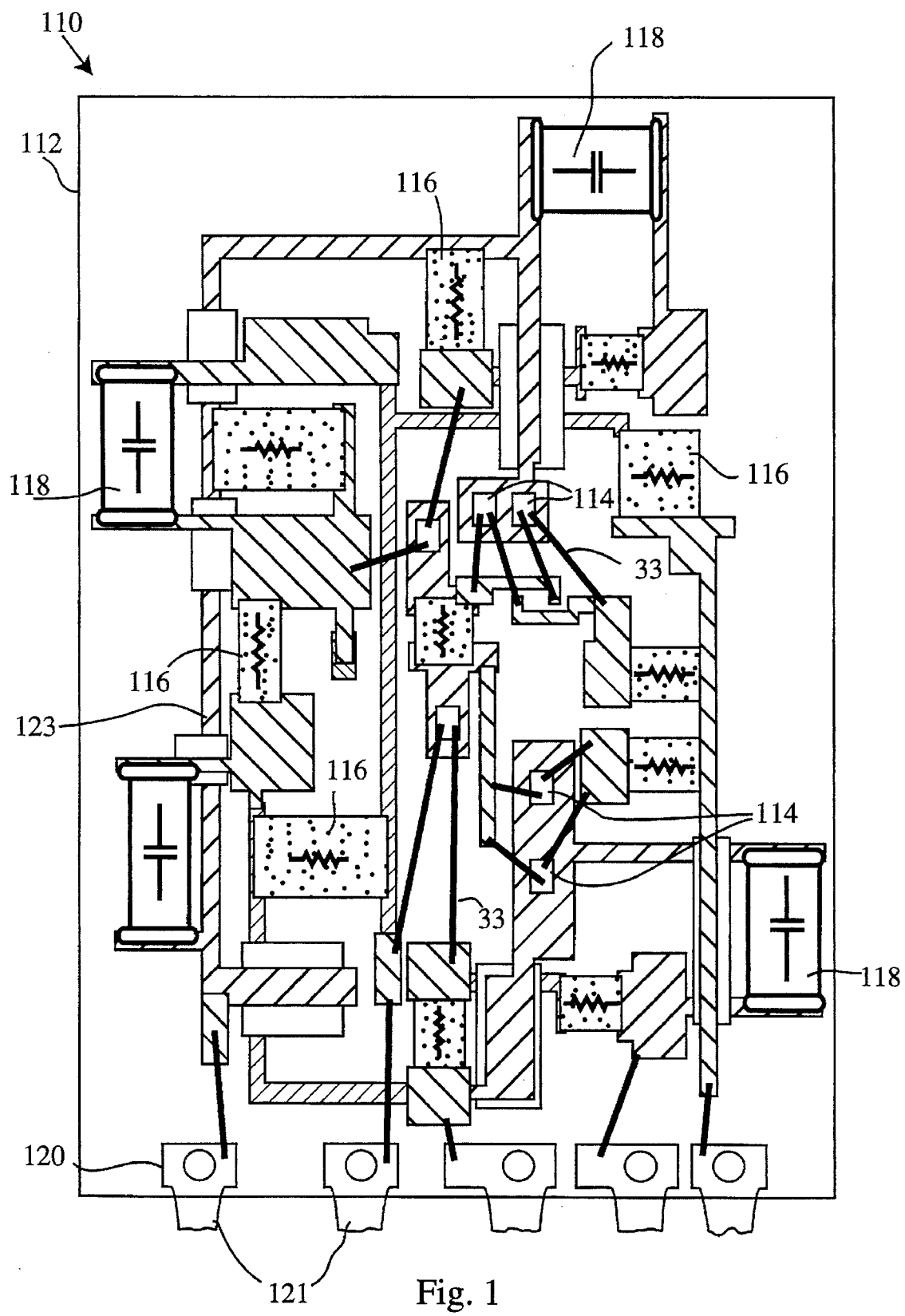
FIG. 1 is a diagrammatic top plan view of a conventional multi-chip package layout.

In order to accommodate stacking, there are at least two important issues that must be considered during the component layout design process. First, the electrical connections between various components must be laid out such that the landings and/or electrical connections for the stacked components do not interfere with the stacked or adjacent components. Second, it is important that any thermal issues be dealt with so that heat generated by one or more of the stacked components does not detrimentally affect the performance of another of the stacked components and/or an adjacent component. The advantage of stacking a discrete component over a film based component in terms of space savings for the overall package will be apparent to those skilled in the art and can probably best be seen by comparing FIGS. 1 and 2. By providing a more compact component layout, the overall size of a given circuit design can be reduced.

Figure 3:
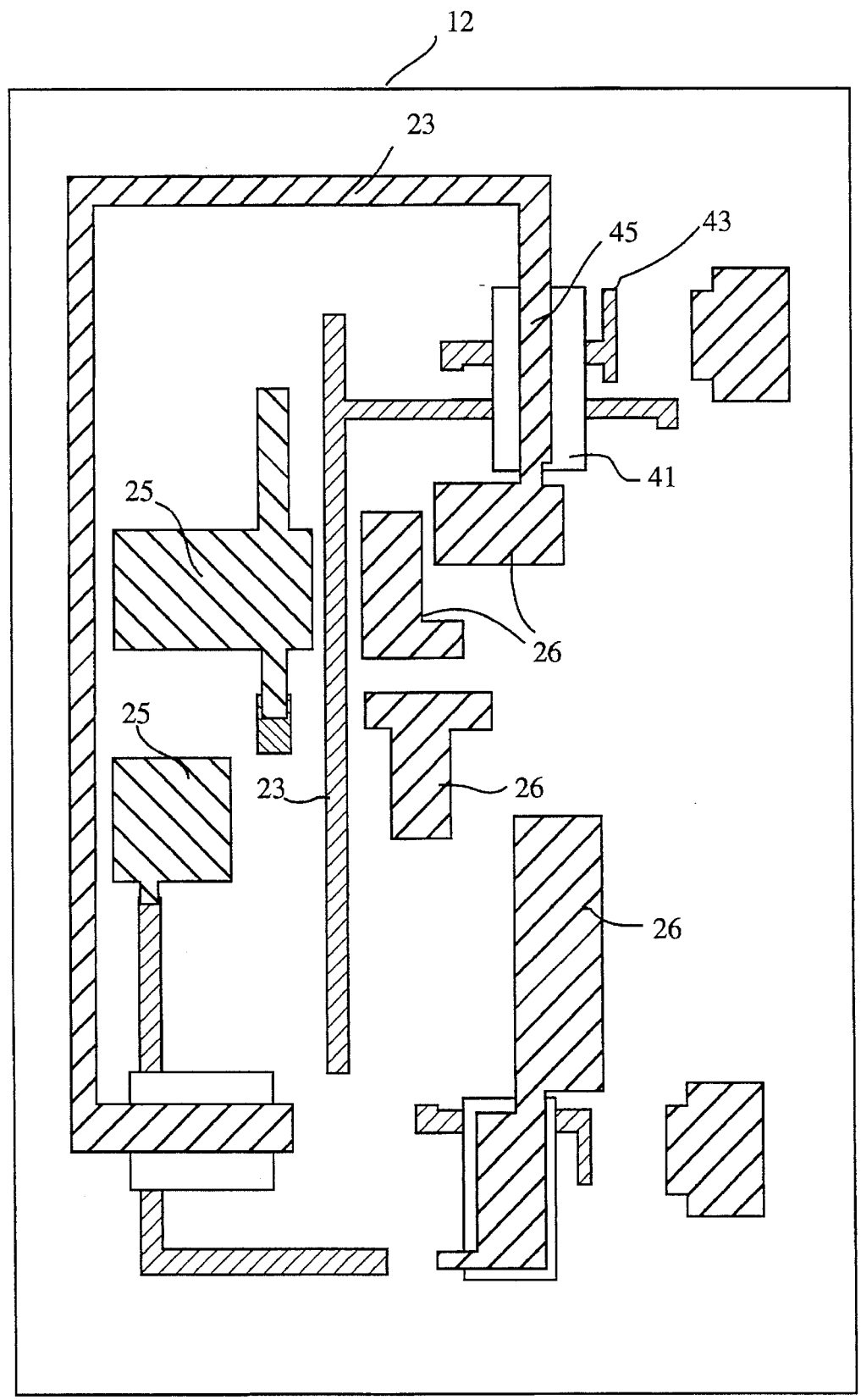
FIG. 3 is a diagrammatic top plan view illustrating traces and landings applied to a substrate.
Figure 4:
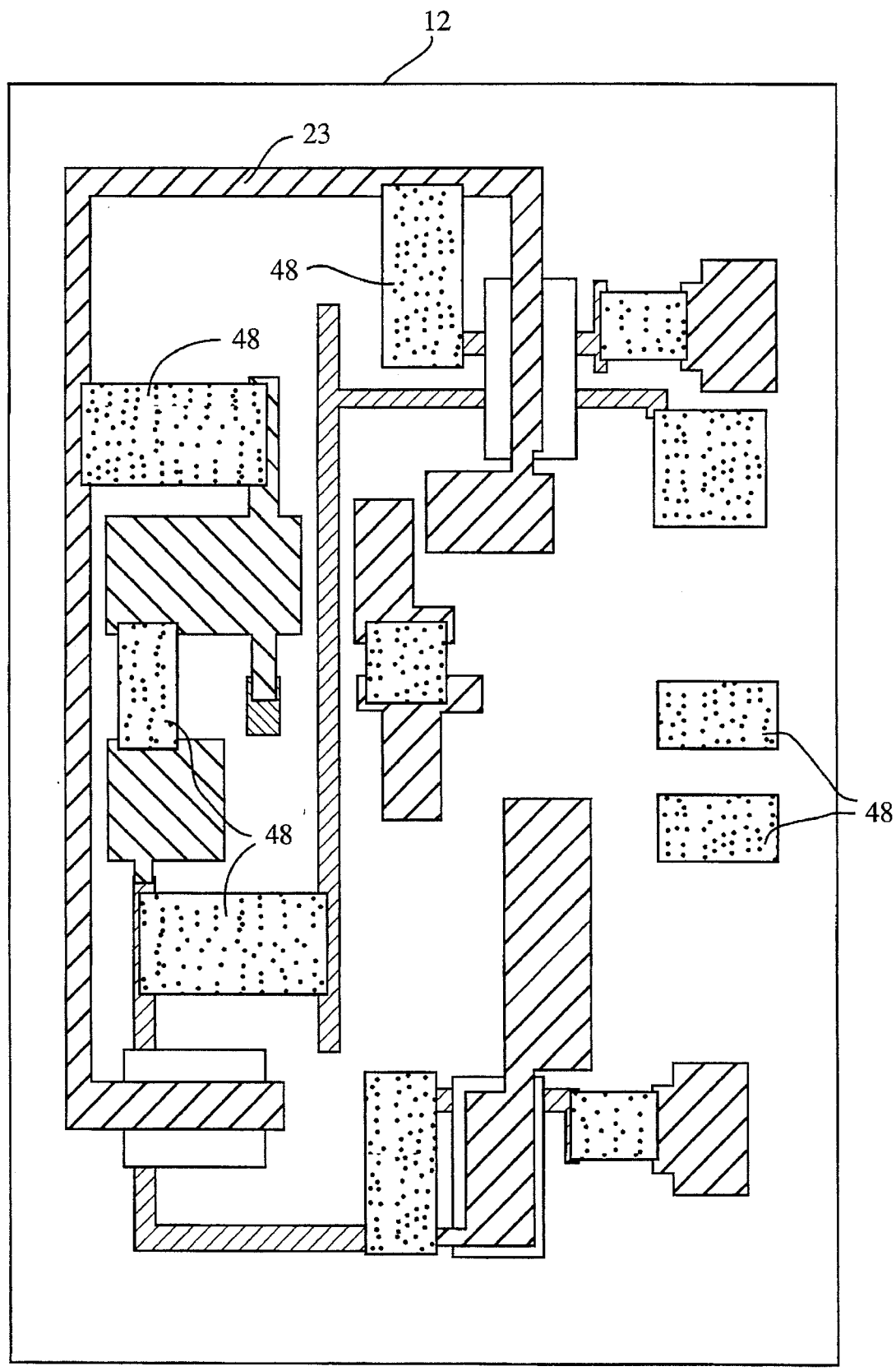
FIG. 4 is a diagrammatic top plan view illustrating the layout of the substrate shown in FIG. 3 after printed components have been applied thereto.

Referring next to FIGS. 3–6, one method of packaging a multi-chip packaged semiconductor device in accordance with the present invention will be described in more detail. Referring initially to FIG. 3, a plurality of wiring traces 23 are initially deposited on a suitable substrate 12 using conventional techniques such as screen printing or photo lithography. When the traces must overlap, the traces may be formed in a plurality of layers with one or more intermediate passivazation layers 41 being formed between overlapping traces (illustrated in FIG. 3 as lower trace 43 and upper trace 45 that are separated by passivazation layer 41). When appropriate, die attach pads 26 can also be formed at the same time from a similar material as the traces 23.

After the traces have been laid, the thick film based components are applied by printing. In the embodiment shown in FIG. 4, film based resistor areas 48 are formed by screening resistive pastes onto the substrate 12. Different resistive pastes can be used to form resistors having widely varying resistances. After the resistors areas 48 have been formed and fired, the resistor areas are trimmed in a conventional manner to create resistors 16 having the desired resistance. When thick film based capacitors or inductors are formed, they may be screened on in a conventional manner as well. When thin film processes are used, the deposition may occur either before or after the trace forming steps.

Figure 5:
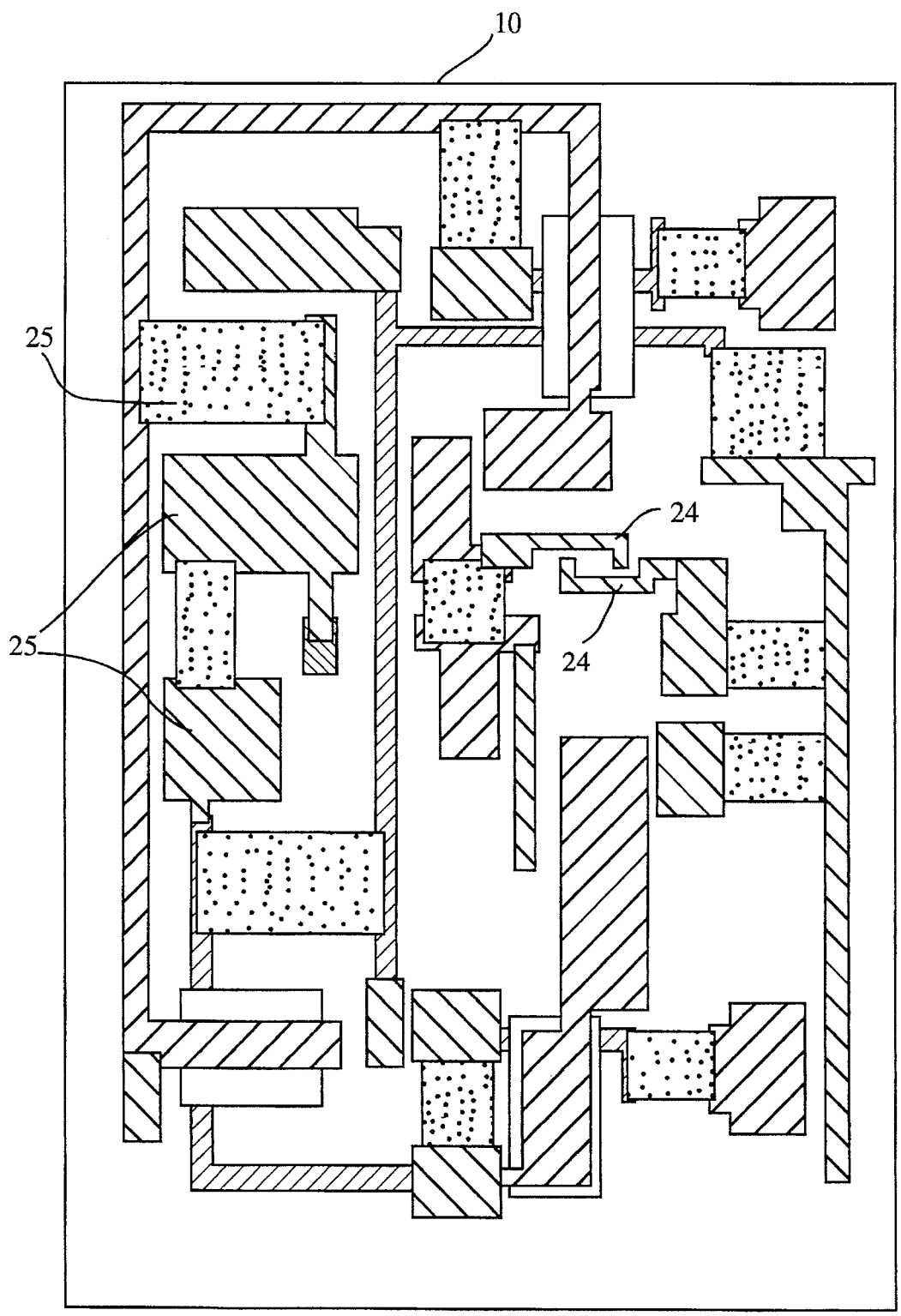
FIG. 5 is a diagrammatic top plan view illustrating the layout of the substrate shown in FIG. 4 after wire bonding and component landing have been applied thereto.
Figure 6:
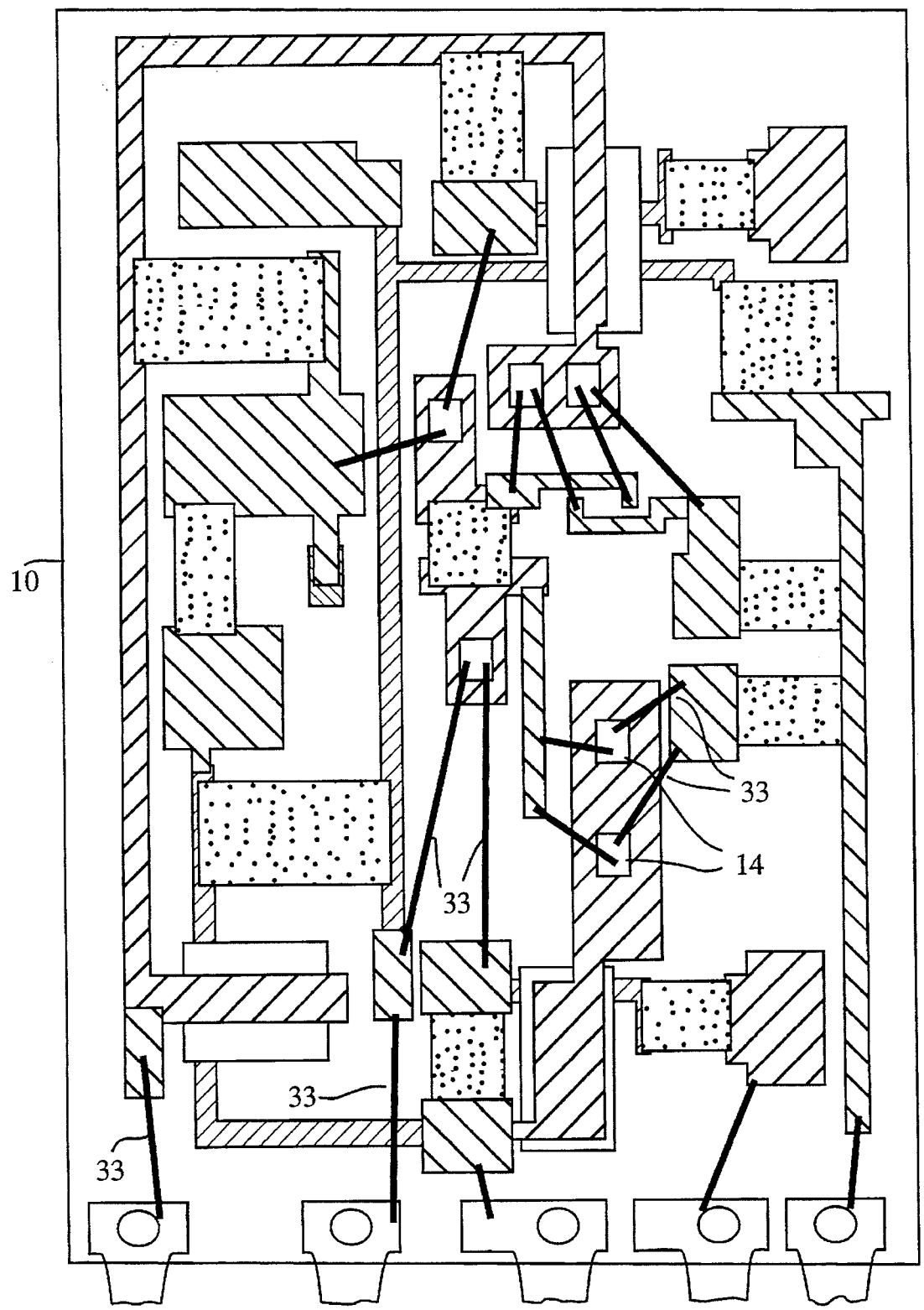
FIG. 6 is a diagrammatic top plan view illustrating the layout of the substrate shown in FIG. 5 after dies have been inserted into place and wire bonded to their associated traces and the leads have been wire bonded to associated traces.

As illustrated in FIG. 5, it may be desirable to apply gold plating 24 either directly on the substrate or over appropriate traces in the area(s) that will serve as wire bonding landings. Additionally, landings 25 for the discrete components may be formed in appropriate positions that overlap associated traces, resistors or other components as necessary to form a good electrical connection between the various landings and any associated traces or other components using a conventional landing forming technique. Suitable landing materials 25 include lead/tin solder, tin/silver solder and conductive epoxies. By way of example, a metalization process may be used to form the landings 25. Of course, the gold plating and landing forming steps may, in alternative embodiments, be carried out before the film based element forming step or more preferably between a film based element forming step and the trimming step. It is preferable to do the trimming after the landing and connecting traces have been formed so that the resistance of the resistors is not changed when the landings and/or platings are applied. It should be appreciated that the landings for stacked discrete elements must be laid out so as not to interfere with the underlying film based component. Thus, the landings would often be positioned clear of the underlying film based component. However, in some cases, the landings may be used as electrical connections for associated resistors as well.

After the resistive paste has been applied and fired, a passivazation layer may be formed over at least the components to be stacked in order to electrically isolate them from the discrete components mounted thereon. However, a more cost effective alternative is often to overglaze the entire substrate after the traces, the landings, and film based components have all been formed. The trimming of film based resistors may be accomplished after the passivazation step. In embodiments wherein a gap is provided to maintain the electrical isolation, the passivazation step is not required.

After the passivazation, the dies are adhered into place. When die attach pads 26 are used, the dies may be attached to their associated die attach pads. In embodiments where the dies are to be attached directly to the substrate, a lead frame or to some other part, they may be attached as appropriate. After the dies have been attached, they are electrically coupled to their associated leads, traces and/or other components. In the embodiment shown in FIG. 6, the dies have been electrically coupled to their associated leads and traces using bonding wires. Of course the electrical connections can be made by mechanisms other than bonding wires if desired for a particular application as discussed above.

After the dies have been attached, the discrete components are mounted on the board and attached to their landings to produce a completed multi-chip package layout as illustrated in FIG. 2. This may be done using conventional soldering techniques. In other embodiments, the discrete components may be attached using conventional laser welding techniques or clip sockets. The stacked discrete components are mounted so that their electrical connections do not interfere with the film based components positioned thereunder. In embodiments where a passivazation layer is provided, the discrete component may be placed directly on top of the film based component with the passivazation layer being position therebetween. In other embodiments, it will be desirable to provide a gap between the film based component and its stacked discrete component to electrically isolate the two.

After all of the discrete components have been attached, the multi-chip device is encapsulated by a package material in a conventional manner such that the various components, bonding wires, traces and a portion of the leads are encapsulated. When appropriate, the substrate may form a part of the package. In other embodiments, the substrate may be encapsulated as well. The package may take any suitable form, as for example a plastic package (often formed by transfer molding), a ceramic package, a metal package and composite packages that combine any of these.

Although a few embodiments of the present invention have been described in detail, it should be understood that the present invention may be embodied in many other specific forms without departing from the spirit or scope of the invention. More particularly, the invention can be applied to products wherein the film based components are formed by either thin or thick film processes and can be utilized regardless of the specific component forming process used. In the embodiments described, specific materials have been identified for use as many of the described elements, however, it should be appreciated that the invention applies equally well to multi-chip packages using other elements as well.

Further, in the embodiment shown, a single discrete component is mounted over a single film based component. From a cost standpoint, this is often an efficient approach. However, it should be appreciated that a discrete component could alternatively be mounted over a small stack of film based components formed in a conventional manner. Additionally, it should be appreciated that the order of the steps in the described method of producing a multi-chip package may in many cases be switched around to meet a particular need. Therefore, the present examples are to be considered as illustrative and not restrictive, and the invention is not to be limited to the details given herein, but may be modified within the scope of the appended claims.

We claim:

1. A multi-chip package comprising:
   a substrate,
   a multiplicity of components including,
      a film based component formed on the substrate,
      a discrete component mounted on the substrate and stacked over the film based component such that the film based component is electrically insulated from the stacked discrete component and the discrete component and the film based component do not electrically interfere with each others function, the discrete components not being formed from a film applied to the substrate, and
      a die component mounted on the substrate;
   a plurality of leads for electrically connecting the multi-chip package to external circuitry, the leads being electrically coupled to associated ones of said multiplicity of components;
   a plurality of wiring traces formed on the substrate, the wiring traces being arranged to electrically connect various ones of said multiplicity of components; and
   a packaging material that encapsulates said multiplicity of components and the wiring traces and leaves a portion of the leads exposed to facilitate electrically connecting the multi-chip package to external circuitry.

2. A multi-chip package as recited in claim 1 further comprising a passivazation layer formed over the film based component such that the passivazation layer electrically isolates the film based component from the discrete component.

3. A multi-chip package as recited in claim 1 wherein the multiplicity of components further include:
   a plurality of additional film based components formed on the substrate; and
   a plurality of additional discrete components mounted on the substrate, the additional film based components and the additional discrete components being electrically coupled to associated ones of said multiplicity of components and leads.

4. A multi-chip package as recited in claim 3 wherein the multiplicity of components further include a plurality of additional die components mounted on the substrate, the additional die components being electrically connected to associated ones of said multiplicity of components and leads.

5. A multi-chip package as recited in claim 3 wherein the film based components are thick film components formed by printing.

6. A multi-chip package as recited in claim 3 wherein the film based components are thin film components formed by deposition.

7. A multi-chip package as recited in claim 1 wherein the film based component is selected from a group consisting of a capacitor, a resistor, and an inductor.

8. A multi-chip package as recited in claim 1 wherein the discrete component is selected from a group consisting of a capacitor, a resistor, an inductor and a crystal.

9. A multi-chip package as recited in claim 1 wherein the leads are part of a lead frame.

10. A multi-chip package as recited in claim 1 further comprising landings for securing the discrete component to the substrate and electrically connecting the discrete component to an associated element selected from the group consisting of associated traces and associated ones of said multiplicity of components.

11. A multi-chip package comprising a substrate, a multiplicity of components including, a film based component formed on the substrate, a discrete component mounted on the substrate and stacked over the film based component such that the film based component is electrically insulated from the stacked discrete component and the discrete component and the film based component do not interfere with each others function, the discrete components not being formed from a film applied to the substrate, and a die component mounted on the substrate;

a plurality of leads for electrically connecting the multi-chip package to external circuitry, the leads being electrically coupled to associated ones of said multiplicity of components;

a plurality of wiring traces formed on the substrate, the wiring traces being arranged to electrically connect various ones of said multiplicity of components;

a packaging material that encapsulates said multiplicity of components and the wiring traces and leaves a portion of the leads exposed to facilitate electrically connecting the multi-chip package to external circuitry; and wherein a gap electrically isolates the film based component from the discrete component.

12. A multi-chip package as recited in claim 11 wherein the multiplicity of components further include:

a plurality of additional film based components formed on the substrate; and a plurality of additional discrete components mounted on the substrate, the additional film based components and the additional discrete components being electrically coupled to associated ones of said multiplicity of components and leads.

13. A multi-chip package as recited in claim 12 wherein the multiplicity of components further include a plurality of additional die components mounted on the substrate, the additional die components being electrically connected to associated ones of said multiplicity of components and leads.

14. A multi-chip package as recited in claim 12 wherein the additional film based components are thick film components formed by printing.

15. A multi-chip package as recited in claim 12 wherein the additional film based components are thin film components formed by deposition.

16. A multi-chip package as recited in claim 11 wherein the film based component is selected from a group consisting of a capacitor, a resistor, and an inductor.

17. A multi-chip package as recited in claim 11 wherein the discrete component is selected from a group consisting of a capacitor, a resistor, an inductor and a crystal.

18. A multi-chip package as recited in claim 11 wherein the leads are part of a lead frame.

19. A multi-chip package as recited in claim 11 further comprising landings for securing the discrete component to the substrate and electrically connecting the discrete component to an associated element selected from the group consisting of associated traces and associated ones of said multiplicity of components.

20. A multi-chip package comprising:

a substrate;

a multiplicity of components including a plurality of film based components, a plurality of discrete components and a plurality of die components, the plurality of film based components being formed on the substrate, the film based components being selected from a group consisting of capacitors, resistors, and inductors;

a passivazation layer formed over selected ones of said film based components that are intended for stacking;

the plurality of discrete components being mounted on the substrate, wherein selected ones of the discrete components that are intended for stacking are stacked over associated ones of the film based components such that the passivazation layer electrically and functionally isolates the associated film based components from the selected ones of the discrete components, the discrete components being selected from a group consisting of capacitors, resistors, inductors and crystals;

the plurality of die components being mounted on the substrate;

a plurality of leads for electrically connecting the multi-chip package to external circuitry, the leads being electrically coupled to associated ones of said multiplicity of components;

a plurality of wiring traces formed on the substrate, the wiring traces being arranged to electrically connect various associated ones of said multiplicity of components; and a packaging material that encapsulates said multiplicity of components and the wiring traces and leaves a portion of the leads exposed to facilitate electrically connecting the multi-chip package.

* * * * *